United States Patent
Jiang et al.

(10) Patent No.: US 6,424,669 B1
(45) Date of Patent: Jul. 23, 2002

(54) INTEGRATED OPTICALLY PUMPED VERTICAL CAVITY SURFACE EMITTING LASER

(75) Inventors: Wenbin Jiang; Hsing-Chung Lee, both of Calabasas; Yong Cheng, Thousand Oaks, all of CA (US)

(73) Assignee: E20 Communications, Inc., Calabasas, CA (US)

( * ) Notice: Subject to any disclaimer, the term of this patent is extended or adjusted under 35 U.S.C. 154(b) by 0 days.

(21) Appl. No.: 09/430,570

(22) Filed: Oct. 29, 1999

(51) Int. Cl.$^7$ .......................... H01S 5/00; H01S 3/094; H01S 3/091; H01S 5/026

(52) U.S. Cl. ............................ 372/50; 372/75

(58) Field of Search ................ 372/43–50, 75, 372/96, 98, 102

(56) References Cited

U.S. PATENT DOCUMENTS

| | | |
|---|---|---|
| 3,949,320 A | 4/1976 | Castleberry et al. |
| 4,633,476 A * | 12/1986 | Scifres et al. ............... 372/45 |
| 4,878,104 A | 10/1989 | Reed et al. |
| 4,901,330 A | 2/1990 | Wolfram et al. |
| 5,008,717 A | 4/1991 | Bar-Joseph et al. |
| 5,023,879 A | 6/1991 | Wang et al. |
| 5,163,058 A | 11/1992 | Farries et al. |
| 5,165,065 A | 11/1992 | Reed et al. |
| 5,216,687 A | 6/1993 | Fujino et al. |
| 5,231,642 A * | 7/1993 | Scifres et al. ............... 372/45 |
| 5,291,502 A | 3/1994 | Pezeshki et al. |
| 5,351,256 A | 9/1994 | Schneider et al. |
| 5,414,726 A | 5/1995 | Raj et al. |
| 5,461,637 A | 10/1995 | Mooradian et al. |
| 5,485,014 A * | 1/1996 | Jain et al. .................. 257/21 |
| 5,504,772 A | 4/1996 | Deacon et al. |
| 5,513,204 A | 4/1996 | Jayaraman |
| 5,536,085 A | 7/1996 | Li et al. |
| 5,623,357 A | 4/1997 | Giles et al. |
| 5,625,635 A | 4/1997 | Kurtz et al. |

(List continued on next page.)

FOREIGN PATENT DOCUMENTS

DE 4444 470 A1 5/1996

OTHER PUBLICATIONS

Laser Electronics, Joseph T. Verdeyen; 1995; Prentice Hall; pp. 347–351; 517–534.
Semiconductor Lasors II, Materials and Structures; Eli Kapon; Academic Press; pp. 164–179.
O'Shea, Donald C., Introduction to Lasers and Their Applications, Dec. 1978, Addison–Wesley Publishing Company, Reading, Massachusetts.
Verdeyen, Joseph T., Laser Electronics, 1995, Prentice–Hall, Inc., Englewood Cliffs, New Jersey.

Primary Examiner—James W. Davie
Assistant Examiner—Davienne Monbleau
(74) Attorney, Agent, or Firm—Blakley Sokoloff Taylor & Zafman (57) ABSTRACT

An integrated optically pumped vertical cavity surface emitting laser (VCSEL) is formed by integrating an electrically pumped in-plane semiconductor laser and a vertical cavity surface emitting laser together with a beam steering element formed with the in-plane semiconductor laser. The in-plane semiconductor laser can be a number of different types of in-plane lasers including an edge emitting laser, an in-plane surface emitting laser, or a folded cavity surface emitting laser. The in-plane semiconductor laser optically pumps the VCSEL to cause it to lase. The in-plane semiconductor laser is designed to emit photons of relatively short wavelengths while the VCSEL is designed to emit photons of relatively long wavelengths. The in-plane semiconductor laser and the VCSEL can be coupled together in a number of ways including atomic bonding, wafer bonding, metal bonding, epoxy glue or other well know semiconductor bonding techniques. The beam steering element can be an optical grating or a mirrored surface.

71 Claims, 6 Drawing Sheets

U.S. PATENT DOCUMENTS

| | | | |
|---|---|---|---|
| 5,627,853 A | 5/1997 | Mooradian et al. | |
| 5,671,243 A * | 9/1997 | Yap | 372/50 |
| 5,680,411 A | 10/1997 | Ramdane et al. | |
| 5,754,578 A | 5/1998 | Jayaraman | |
| 5,778,015 A | 7/1998 | Gunning | |
| 5,793,787 A | 8/1998 | Meyer et al. | |
| 5,796,771 A * | 8/1998 | DenBaars et al. | 372/75 |
| 5,835,517 A | 11/1998 | Jayaraman et al. | |
| 5,914,976 A | 6/1999 | Jayaraman et al. | |
| 5,963,576 A | 10/1999 | Claisse et al. | |
| 5,985,686 A | 11/1999 | Jayaraman | |
| 6,026,108 A * | 2/2000 | Lim et al. | 372/50 |
| 6,054,335 A | 4/2000 | Sun et al. | |
| 6,097,742 A | 8/2000 | Caprara et al. | |
| 6,104,739 A | 8/2000 | Hong et al. | |
| 6,127,200 A | 10/2000 | Ohiso et al. | |
| 6,167,068 A | 12/2000 | Caprara et al. | |
| 6,195,381 B1 * | 2/2001 | Botez et al. | 372/96 |

* cited by examiner

INTEGRATED OPTICALLY PUMPED VERTICAL CAVITY SURFACE EMITTING LASER

FIELD OF THE INVENTION

The present invention relates generally to semiconductor lasers. More particularly, the present invention relates to optically pumped semiconductor lasers.

BACKGROUND OF THE INVENTION

Semiconductor lasers have become more important. One of the most important applications of semiconductor lasers is in communication systems where fiber optic communication media is employed. With growth in electronic communication, communication speed has become more important in order to increase data bandwidth in electronic communication systems. Improved semiconductor lasers can play a vital roll in increasing data bandwidth in communication systems using fiber optic communication media such as local area networks (LANs), metropolitan area networks (MANs) and wide area networks (WANs). A preferred component for optical interconnection of electronic components and systems via optical fibers is a semiconductor laser known as a vertical cavity surface emitting laser (VCSEL). The current state of design and operation of VCSELs is well known. Due to optical properties of optical fibers, photons emitted at longer wavelengths from a laser tend to propagate longer distances and are less disturbed by optical noise sources. Thus, forming a VCSEL that can operate at longer wavelengths, such as a wavelength greater than 1.25 $\mu$m, is desirable.

Lasers can be excited or pumped in a number of ways. Typically, VCSELs have been electrically excited (electrically pumped) by a power supply in order to stimulate photon emission. However, achieving photon emission at long wavelengths using electrical pumping has not been commercially successful due to a number of disadvantages. Presently, there is no viable monolithic electrically pumped long wavelength VCSEL solution for practical applications. It is desirable to use an Indium-Phosphide semiconductor substrate for long wavelength VCSEL operation. However, there is no monolithic semiconductor distributed Bragg reflector (DBR) which can lattice match with an Indium-Phosphide substrate and provide a large enough difference in index of refraction for reflecting a laser beam. Lattice matching is important in order to maintain laser material growth dislocation-free. Alternatives have been proposed and demonstrated with limited success. One solution is to wafer bond an Indium-Phosphide based active material system with a Gallium-Arsenide/Aluminum-Gallium-Arsenide (GaAs/AlGaAs) DBR. While constant wave (CW) operation of up to 70 degrees centigrade has been achieved, the output power is too low for the device to be of any use.

Figure 1:
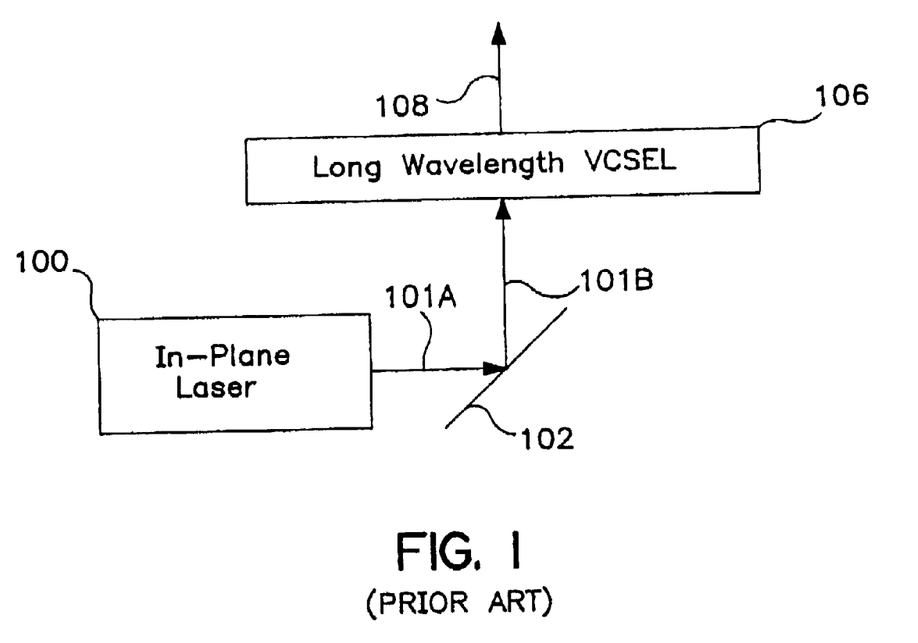
FIG. 1 is a block diagram of a prior art system of optically pumping a long-wavelength VCSEL.

More recently it has been shown that a VCSEL can be optically excited (optically pumped) to stimulate photon emission. Referring now to FIG. 1, it has been shown that an in-plane laser 100 can have its emitted photons 101A redirected by a mirror 102 into the direction of photons 101B for coupling into a VCSEL 106. The in-plane laser 100 is designed to be electrically excited in order to emit photons 101A at relatively short wavelengths (850 nanometers (nm) to 980 nanometers (nm)). The redirected photons 101B from the in-plane laser 100, also having relatively short wavelengths, optically excite the VCSEL 106. The VCSEL 106 is designed to be optically excited in order to emit photons 108 at relatively long wavelengths (1250 nm to 1800 nm). A disadvantage to the system of FIG. 1 is that its components are not integrated together. In U.S. Pat. Nos. 5,513,204 and 5,754,578 by Vijaysekhar Jayaraman (referred to as the "Jayaraman Patents") it is shown how to integrate an electrically pumped short wavelength VCSEL together with an optically pumped long wavelength VCSEL. However, there are a number of disadvantages to the integrated solution offered by the Jayaraman Patents. One problem with using an electrically pumped short wavelength VCSEL to optically pump a long wavelength VCSEL is that enormous heat is generated in the electrically pumped short wavelength VCSEL due to electrical current injection. The heat generated by the electrically pumped VCSEL can not be dissipated efficiently which then is coupled into the long wavelength VCSEL increasing its junction temperature such that it can not lase efficiently. Another disadvantage is that the electrical resistivity is high because the electrical contact area in the electrically pumped short wavelength VCSEL is relatively small, and the current has to go through many layers of resistive p-type doped DBR. Another disadvantage in using an electrically pumped VCSEL is that the thermal resistance is high because of a restricted heat flow path. The small carrier confinement region in an electrically pumped VCSEL causes heat to accumulate in a small area from which it is difficult to dissipate. Another disadvantage is that the output power from an electrically pumped short wavelength VCSEL is limited, which negatively impacts the output power from the optically pumped long wavelength VCSEL as well. The integrated solution of the Jayaraman Patents can not provide sufficient power to meet a data link module specification of providing a constant wave power output at eighty degrees Centigrade. Another disadvantage is that the cost of manufacturing the two VCSELs as proposed in the Jayaraman Patents is relatively high.

It is desirable to overcome the limitations of the prior art.

BRIEF SUMMARY OF THE INVENTION

Briefly, the present invention includes a method, apparatus and system as described in the claims. An integrated optically pumped vertical cavity surface emitting laser (VCSEL) is formed by integrating an electrically pumped in-plane semiconductor laser and a vertical cavity surface emitting laser together with a beam steering element formed with the in-plane semiconductor laser. The in-plane semiconductor laser can be a number of different types of in-plane lasers including an edge emitting laser, an in-plane surface emitting laser, or a folded cavity surface emitting laser. The in-plane semiconductor laser optically pumps the VCSEL to cause it to lase. The in-plane semiconductor laser is designed to emit photons of relatively short wavelengths while the VCSEL is designed to emit photons of relatively long wavelengths. The in-plane semiconductor laser and the VCSEL can be coupled together in a number of ways including atomic bonding, wafer bonding, metal bonding, epoxy glue or other well know semiconductor bonding techniques. The beam steering element can be an optical grating or a mirrored surface. A number of embodiments of the integrated optically pumped vertical cavity surface emitting laser are disclosed.

BRIEF DESCRIPTIONS OF THE DRAWINGS

Like reference numbers and designations in the drawings indicate like elements providing similar functionality.

DETAILED DESCRIPTION OF THE PREFERRED EMBODIMENT

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

An integrated optically pumped vertical cavity surface emitting laser (VCSEL) is formed by integrating an electrically pumped in-plane semiconductor laser and a vertical cavity surface emitting laser together with a beam steering element formed with the in-plane semiconductor laser. The in-plane semiconductor laser can be a number of different types of in-plane lasers including an edge emitting laser, an in-plane surface emitting laser, or a folded cavity surface emitting laser. The in-plane semiconductor laser optically pumps the VCSEL to cause it to lase. The in-plane semiconductor laser is designed to emit photons of relatively short wavelengths while the VCSEL is designed to emit photons of relatively long wavelengths. The in-plane semiconductor laser and the VCSEL can be coupled together in a number of ways including atomic bonding, wafer bonding, metal bonding, epoxy glue or other well known semiconductor bonding techniques. The beam steering element can be an optical grating or a mirrored surface. A number of embodiments of the integrated optically pumped vertical cavity surface emitting laser are disclosed.

The electrically pumped in-plane short wavelength semiconductor laser is designed to operate at relatively short wavelengths (from 770 nanometers (nm) to 1100 nanometers (nm)) with an optically pumped long wavelength VCSEL designed to operate at relatively long wavelengths (from 1250 nm to 1700 nm). The in-plane short wavelength semiconductor laser of the integrated optically pumped VCSEL can be a conventional edge emitting laser or an in-plane surface emitting laser. The long wavelength VCSEL operates without the use of electric power by being optically pumped by the short wavelength semiconductor laser which is electrically pumped. Integration of the lasers depends upon the type of semiconductor materials utilized in forming the two lasers. The two lasers are integrated into one unit through semiconductor processing methods such as monolithic epitaxial growth or by joining outer layers of the two lasers together through atomic bonding, wafer bonding, metal bonding, epoxy glue or other well known semiconductor bonding techniques. Additionally, the vertical cavity surface emitting laser can be bonded to the in-plane semiconductor laser at an angle in order to avoid reflected light from the long wavelength VCSEL being directly returned to the in-plane laser thereby avoiding optical noise being fed back to the in-plane laser. A third laser can also be used to generate a small spot pump beam to couple to the vertical cavity surface emitting laser in order to gain guide photons to emit at a single mode transversely. Although the in-plane short wavelength semiconductor laser, also referred to as the pump laser, can be multimode either longitudinally or transversely, the output from the long wavelength VCSEL is single mode longitudinally. The output from the long wavelength VCSEL can be single mode transversely depending upon the geometric integration scheme and patterning. It is preferred that the long wavelength VCSEL operate in a single transverse mode to optimally couple with a single mode fiber. Modulation of the long wavelength VCSEL can be achieved through either direct electrical modulation of the in-plane short wavelength semiconductor laser or external modulation using an external modulator.

Figure 2:
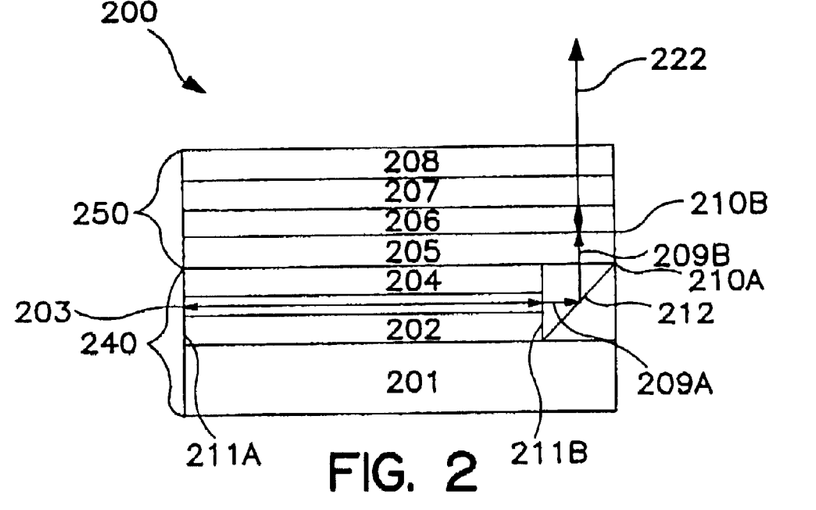
FIG. 2 is a magnified cross sectional view of a first embodiment of the integrated optically pumped long wavelength VCSEL of the present invention.

Referring now to FIG. 2, an integrated optically pumped VCSEL 200 as a first embodiment of the present invention is illustrated. The integrated optically pumped VCSEL 200 includes a short wavelength in-plane semiconductor laser, the edge-emitting laser 240, integrated with a long wavelength VCSEL 250. The edge emitting (EE) laser 240 can emit a laser beam (i.e. photons) at a wavelength over a range from 600 nm to 1110 nm. The edge emitting laser 240 will typically emit photons having wavelengths of 780 nm, 850 nm, or 980 nm. The laser beam 209A is steered by a beam steering element 212 towards the long wavelength VCSEL 250 to optically pump it. In response to the optical pumping, the long wavelength VCSEL 250 emits a laser beam at a wavelength over a range from 1250 nm to 1650 nm. The long wavelength VCSEL 250 typically emits a laser bean having a wavelength of 1300 nm or 1550 nm. The beam steering element 212 can be a mirror, an optical grating or other reflecting surface. The beam steering element 212 in the preferred embodiment steers photons at an angle substantially perpendicular with the beam 209A to form laser beam 209B. In this case the incident and refractive angles are substantially forty-five degrees.

The edge emitting laser 240 includes a substrate 201, a cladding layer 202, an active area 203, and a cladding and contact layer 204. The substrate 201 is preferably Gallium-Arsenide (GaAs) which may be removed after the formation of the integrated optically pumped VCSEL structure 200 is completed. The cladding 202 is preferably Gallium-Arsenide (GaAs) or Aluminum-Gallium-Arsenide (AlGaAs). The substrate 201 or cladding layer 202 may act as the contact layer for making one of the electrical contacts for the electrically pumped in-plane semiconductor laser. The active layer 203 has its materials selected depending upon the desired wavelength of photons output. In the case that 980 nanometers (nm) wavelength is desired, active layer 203 is InGaAs quantum wells (QWs). In the case that 850 nm is desired, the active layer 203 is Gallium-Arsenide (GaAs) QWs. In the case that the desired wavelength is 780 nm, the active layer may be Gallium-Aluminum-Arsenide (GaAlAs) or Gallium-Indium-Arsenide-Phosphide (GaInAsP) QWs. In the preferred embodiment the cladding and contact layer 204 is a P-type GaAs material. To stimulate emission, the straight facets 211A and 211B act as mirrors for the laser cavity. The facets 211A and 211B are parallel to each other and formed by cleaving, etching, ion milling or other well known semiconductor process. A dielectric coating may be added to the facets 211A and 211B to act as a mirror coating to increase the reflectivity efficiency. The photons emitted from the edge-emitting laser 240 are reflected or deflected by the beam steering element 212 into the long wavelength VCSEL 250. The beam steering element 212 is set an angle of approximately forty five degrees with the incident photons to reflect them towards the long wavelength VCSEL 250. The beam steering element 212 is formed by dry etching or ion milling processes or other well known semiconductor process for removing materials. The facets 211A and 211B are coupled to the laser cavity of the in-plane semiconductor laser while the beam steering element 212 is formed exterior to the cavity but integrated with the integrated optically pumped VCSEL 200. The long wavelength VCSEL 250 is comprised of a distributed Bragg reflector (DBR) 205, a long wavelength active area 206, a second distributed Bragg reflector (DBP) 207 and a substrate 208. The distributed Bragg reflector (DBR) 205 is specifically designed for the desired long wavelength by forming the pairs of materials with a quarter wavelength in thickness for each layer. The DBR 205 may be a dielectric DBR, a GaAs/AlGaAs DBR, an InP/InGaAsP DBR, or an InP/InAlGaAs DBR. The dielectric DBR is formed by depositing silicon dioxide/titanium dioxide pairs of quarter wavelength thickness layers or other equivalent material layers. The active area 206 for the long wavelength VCSEL may be a single quantum well or a multiple number of quantum wells formed from materials such as InGaAsP or InAlGaAs. In the preferred embodiment, the active area 206 has 3 to 9 quantum wells formed of InGaAsP. DBR 207 is formed similarly to the DBR 205 for long wavelength VCSEL operation. Substrate 208, upon which the long wavelength VCSEL 250 has been formed, is preferably an InP substrate or a GaAs substrate which may be removed after the integrated optically pumped VCSEL structure is completed after bonding together. The edge-emitting laser 240 may include a ridge-wave guide, a rib-wave guide, an oxide-confined or other well-known lasing enhancement structure. The long wavelength VCSEL 250 may be gain guided by pumping, index guided by oxide, or index guided by etching mesas. In operation, laser beam 209A is reflected back and forth between facets 211A and 211B before being emitted by the edge-emitting laser 240 as the short wavelength laser output. Laser beam 209A is steered by the beam steering element 212 substantial perpendicular in the direction of laser beam 209B. Laser beam 209B is coupled into the long wavelength VCSEL 250 to optically pump it into generating the laser beam 222 at long wavelengths.

In-plane semiconductor lasers such as edge-emitting lasers are relatively easy to manufacture with a relatively high power output. Edge-emitting lasers have the advantage of spreading out the heat generated by the active area 203 such that its thermal resistance is lower. Additionally, the edge-emitting laser has a larger surface area for making electrical contacts such that the electrical resistance is also reduced. Because the electrically pumped in-plane semiconductor lasers, including edge-emitting laser 240, can generate sufficiently high power there is no need to coat the beam steering elements to improve the reflection efficiency into the long wavelength VCSEL 250. In the first embodiment of the integrated optically pumped VCSEL of FIG. 2, the edge emitting laser 240 is bonded to the long wavelength VCSEL 250 at either the bonding interface 210A or 210B depending upon whether the DBR 205 of the VCSEL 250 is grown with the edge emitting laser 240. If DBR 205 is made of pairs of GaAs/AlGaAs materials it is grown with the edge emitting laser 240 and the bonding interface between the lasers is 210B. If the DBR 205 is not made of pairs of GaAs/AlGaAs materials but of some other material such as a dielectric DBR, InP/InGaAsP DBR, or InP/InAlGaAsP DBR, then the bonding interface between the lasers is 210A. The two lasers are bonded together at either bonding interface 210A or 210B through atomic bonding, molecular bonding, metal bonding, epoxy bonding, or other well-known bonding methods for bonding semiconductor materials. The material used to bond at the bonding interface 210A or 210B is optically transparent for transmission of photons at the desired wavelength.

Figure 3A:
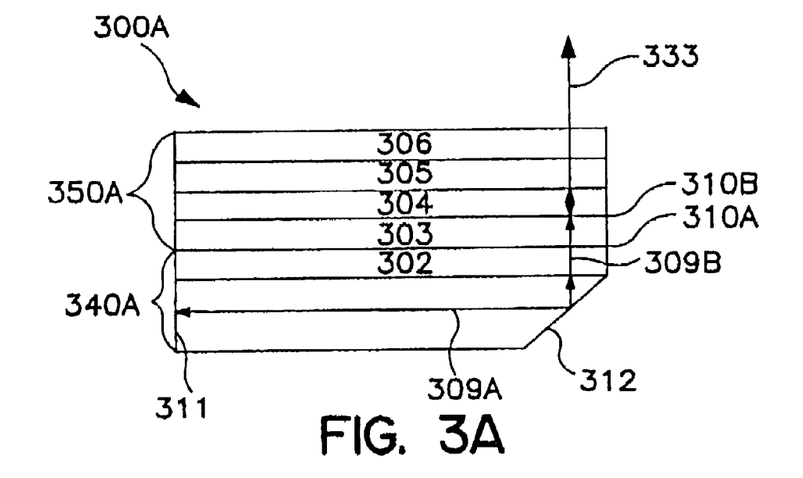
FIGS. 3A through 3F are second through seventh embodiments of the integrated optically pumped long wavelength VCSEL of the present invention.

Referring now to FIGS. 3A through 3F, integrated optically pumped VCSELs 300A through 300F are illustrated. In FIG. 3A, the integrated optically pumped VCSEL 300A comprises an in-plane semiconductor laser, an in-plane surface emitting laser 340A, and a long wavelength VCSEL 350A. The in-plane surface emitting laser 340A is coupled to the long wavelength VCSEL 350A at either the bonding interface 310A or bonding interface 310B depending upon whether the DBR 303 of the VCSEL 350A is grown with the in-plane surface emitting laser 340A or not. If DBR 303 is made of pairs of GaAs/AlGaAs materials it is grown with the in-plane surface emitting laser 340A and the bonding interface between the lasers is 310B. If the DBR 303 is not made of pairs of GaAs/AlGaAs materials but of some other material such as a dielectric DBR, InP/InGaAsP DBR, or InP/InAlGaAsP DBR which is grown with the VCSEL 350A, then the bonding interface between the lasers is 310A. The in-plane surface emitting laser 340A may be bonded to the long wavelength VCSEL 350A by means of wafer bonding, metal bonding, epoxy bonding, or other well-known semiconductor bonding techniques. The in-plane surface emitting laser 340A is composed of multiple layers of well-known materials similar to in-plane laser 240 in FIG. 2. The in-plane laser can include confinement structures including an etched mesa, rib or oxide carrier confinement structure forming a ridge waveguide in-plane semiconductor laser, a rib waveguide in-plane semiconductor laser, or an oxide confined in-plane semiconductor laser respectively. The in-plane surface emitting laser 340A includes a laser cavity mirror 302 coupled to a cladding layer to reflect photons within the laser cavity and allow photons of sufficient energy to pass through. In-plane surface emitting laser 340A is preferably manufactured and designed to lase at 780 nm, 850 nm, or 980 nm. The substrate of the in-plane surface emitting laser is preferably Gallium-Arsenide (GaAs), which is optionally removed from the integrated optically-pumped VCSEL 300A. In contrast with the beam steering element 212 being outside the laser cavity, the in-plane surface emitting laser 340A includes the beam steering element 312 in the laser cavity of the in-plane surface emitting laser 340A for reflection. The beam steering element 312 is preferably at an angle of substantially forty five degrees and is formed by etching the semiconductor materials of the in-plane surface emitting laser 340A. The straight facet 311 is formed by cleaving or etching substantially perpendicular with the semiconductor materials of the laser 340A. The beam steering element 312 within the laser cavity provides a total reflection to the incoming light from either the in-plane laser cavity facet 311 or from the laser cavity mirror 302. The laser cavity mirror 302 is formed similarly to a DBR and includes layers of the pair of materials $Al_xGa_{1-x}As/Al_yGa_{1-y}As$ to reflect and transmit the short wavelength photons. The laser cavity mirror 302 and the beam steering element 312 can be substituted for a grating surface forming an in-plane grating surface emitting laser. The grating surface can have its ridges formed (spacing, etching angles, etc.) such that it can act both as a mirror surface to reflect photons in the laser cavity and to steer short wavelength photons into the long wavelength VCSEL 350A. The long wavelength VCSEL 350A comprises a distributed Bragg reflector (DBR) 303, active area 304, a second DBR 305, and a substrate 306. The short wavelength photons generated by the in-plane surface emitting laser 340A are preferably of wavelengths 780 nm, 850 nm, or 980 nm. DBR 303 and DBR 305 are designed specifically for the long wavelength VCSEL 350A and can be a dielectric DBR, an $Al_xGa_{1-x}As/Al_yGa_{1-y}As$ DBR, or a InP/InGaAsP DBR. The active area 304 is specifically designed for long wavelength VCSELs and may be a single or multiple quantum well structure formed from Indium-Gallium-Arsenide-Phosphide (InGaAsP), Indium-Gallium-Arsenide (InGaAs), Indium-Aluminum-Gallium-Arsenide (InAlGaAs), Gallium-Arsenide-Antimonide (GaAsSb), or Indium-Gallium-Arsenide-Nitride (InGaAsN). Substrate 306, depending on the other materials used in forming the VCSEL laser 350A, is an InP or a GaAs substrate. In the operation of the integrated optically pumped VCSEL 300A, the photons 309A at short wavelengths are reflected between by the straight facet 311, the beam steering element 312 and the laser cavity mirror 302 of the in-plane surface emitting laser 340A. The laser beam 309B of short wavelength photons output from the in-plane surface emitting laser 340A are coupled into the long wavelength VCSEL 350A to optically pump it. Upon reaching the lasing threshold, the long wavelength VCSEL 350A emits the long wavelength photons 333.

Figure 3B:
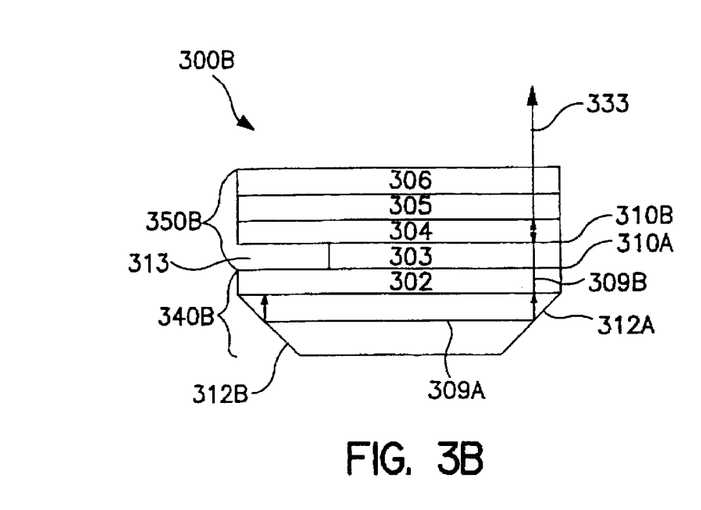

Referring now to FIG. 3B, the integrated long wavelength optically pumped VCSEL 300B having the in-plane surface emitting laser 340B and the long wavelength VCSEL 350B is illustrated. The integrated optically pumped VCSEL 300B is similar to the integrated optically pumped VCSEL 300A but has two beam steering elements 312A and 312B formed in the cavity of the in-plane surface emitting laser 340B. The beam steering element 312B is preferable over the straight edged facet 311 in that it is simpler to manufacture and provides a more efficient reflective surface which provides a higher output power. The beam steering element 312B is similar to the beam steering element 312A. To avoid two laser beams being emitted from two locations of the surface of the VCSEL, a portion 313 of the DBR mirror 303 is removed where the laser beam would otherwise be reflected to eliminate one of the long wavelength VCSEL resonant cavity mirrors. Portion 313 is removed preferably by etching but other well known semiconductor processing techniques may be used such as ion milling. The other elements of the in-plane surface emitting laser 340B and the long wavelength VCSEL 350B are similar to lasers 340A and 350A previously described with respect to the integrated long wavelength VCSEL 300A of FIG. 3A.

Figure 3C:
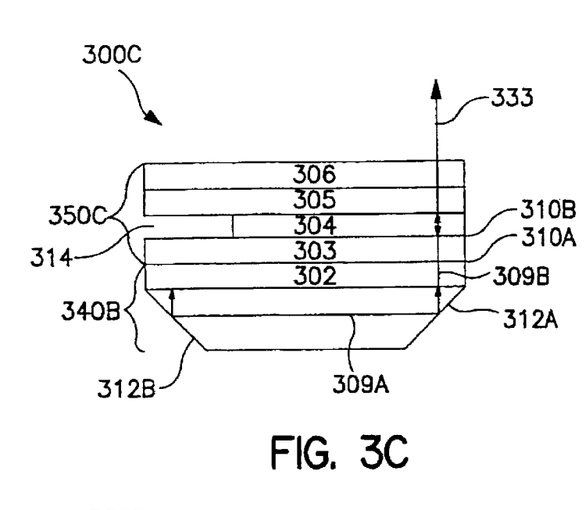

Referring now to FIG. 3C, the integrated long wavelength optically pumped VCSEL 300C with in-plane surface emitting laser 340B and long wavelength VCSEL 350C is illustrated. Integrated optically pumped VCSEL 300C has the same in-plane surface emitting laser 340B as does VCSEL 300B with the beam steering elements 312A and 312B. In the long wavelength VCSEL 350C, instead of portion 313 being removed from layer 303, portion 314 is removed from the active area 304 in order for the single laser beam 333 to be emitted from the surface of the long wavelength VCSEL 350C. Otherwise, similarly numbered elements of the in-plane surface emitting laser 340B and the VCSEL 350C are similar to those previously described with respect to FIG. 3B and the integrated optically pumped VCSEL 300B.

Figure 3D:
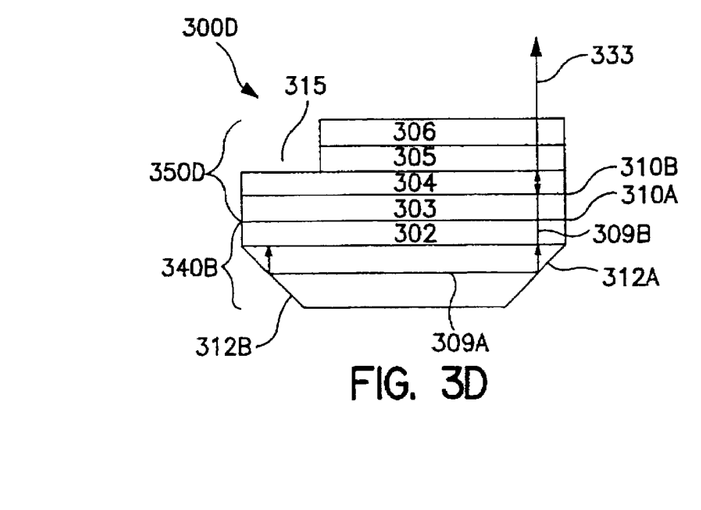

Referring now to FIG. 3D, a fifth embodiment, integrated optically pumped VCSEL 300D is illustrated. The integrated optically pumped VCSEL 300D includes the in-plane surface emitting laser 340B and the long wavelength VCSEL 350D. Integrated optically pumped VCSEL 300D has the same in-plane surface emitting laser 340B as does VCSEL 300B with the beam steering elements 312A and 312B. Instead of portion 313 or 314, the long wavelength VCSEL 350D has portion 315 removed from the material of the distributed Bragg reflector (DBR) 305 and the substrate 306. This causes a single laser beam 333 to be emitted from the surface of the long wavelength VCSEL 350D. Otherwise, similarly numbered elements of the in-plane surface emitting laser 340B and the VCSEL 350D are similar to those previously described with respect to FIG. 3B and the integrated optically pumped VCSEL 300B.

Figure 3E:
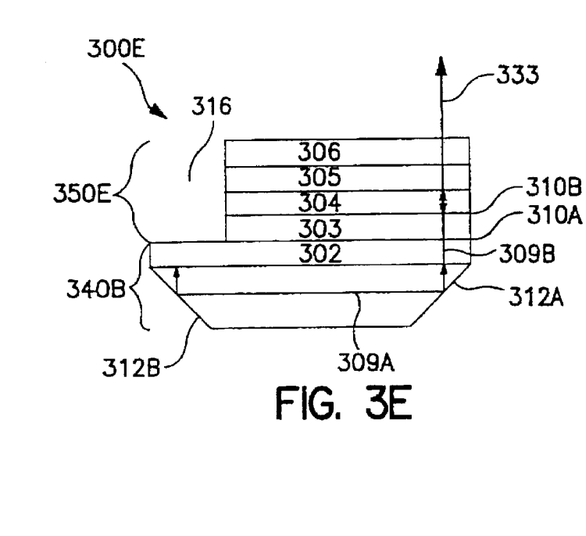

Referring now to FIG. 3E, the integrated optically pumped VCSEL 300E is illustrated. The integrated optically pumped VCSEL 300E includes the in-plane surface emitting laser 340B and the long wavelength VCSEL 350E. Integrated optically pumped VCSEL 300E has the same in-plane surface emitting laser 340B as does VCSEL 300B with the beam steering elements 312A and 312B. Instead of portions 313, 314, or 315, the long wavelength VCSEL 350E now has a portion 316 removed from the distributed Bragg reflector (DBR) 303, the active area 304, DBR 305, and the substrate 306. In this manner a single laser beam 333 is emitted from the long wavelength VCSEL 350E. Otherwise, similarly numbered elements of the in-plane surface emitting laser 340B and the VCSEL 350E are similar to those previously described with respect to FIG. 3B and the integrated optically pumped VCSEL 300B.

Figure 3F:
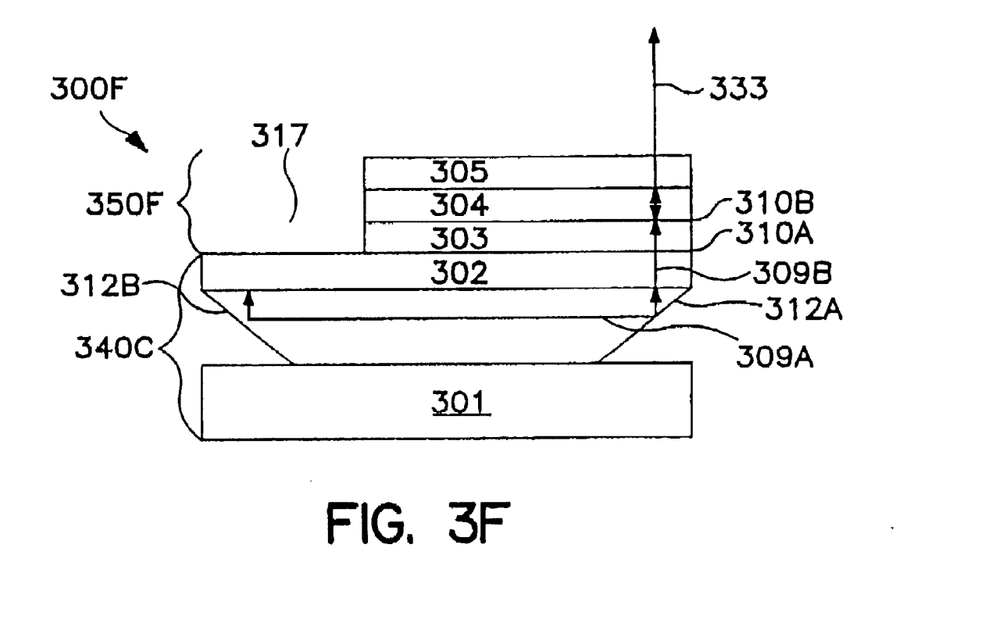

Referring now to FIG. 3F, a seventh embodiment of the integrated optically pumped VCSEL 300F is illustrated. The integrated optically pumped VCSEL 300F includes the in-plane surface emitting laser 340C and the long wavelength VCSEL 350F. The in-plane surface emitting laser 340C includes its own substrate 301 and the beam steering elements 312A and 312B. The long wavelength VCSEL 350F has its substrate 306 removed and instead of portions 313, 314, 315, or 316, a portion 317 is removed from the distributed Bragg reflector (DBR) 303, active area 304, and DBR 305. FIG. 3F illustrates how either one of the substrate for the in-plane surface emitting laser 340 or the substrate for the long wavelength VCSEL 350 can be removed.

Figure 4A:
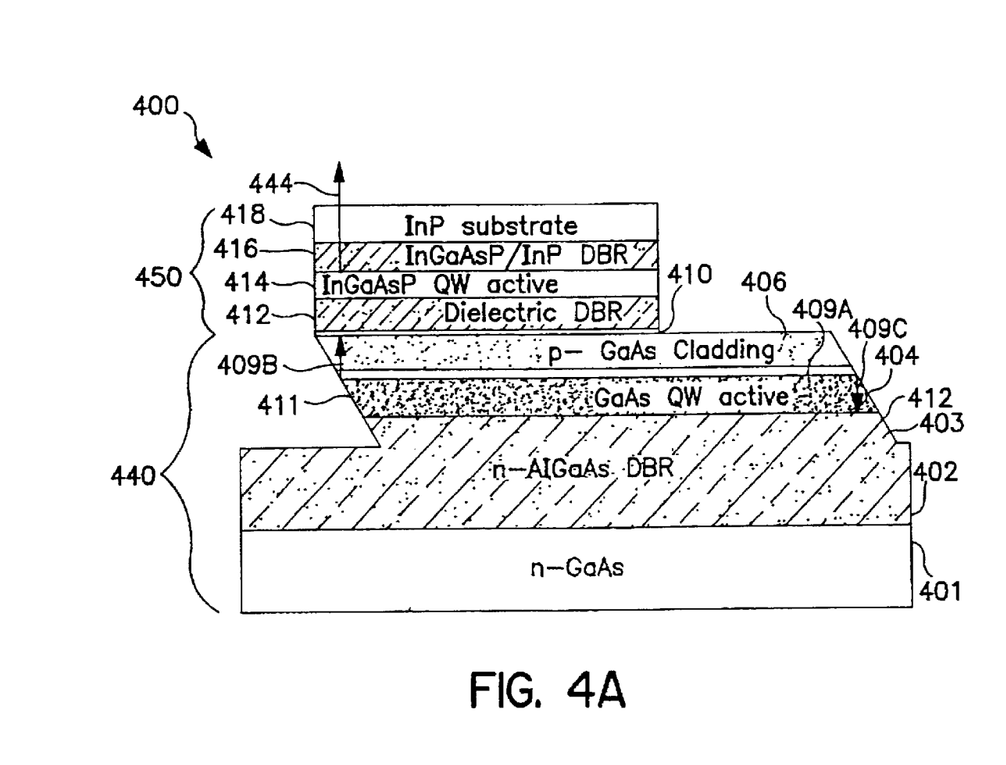
FIGS. 4A and 4B are magnified cross sectional views of an eighth embodiment of the integrated optically pumped long wavelength VCSEL of the present invention.

Referring now to FIG. 4A, the integrated optically pumped VCSEL 400 is illustrated. The integrated optically pumped VCSEL 400 includes a folded cavity surface emitting laser (FCSEL) 440 integrated with a long wavelength VCSEL 450. The folding cavity surface emitting laser 440 includes an n-type doped GaAs substrate 401, a distributed Bragg reflector (DBR) 402, an active area 404, and a cladding layer 406. The substrate 401 is preferably GaAs. The layers of the DBR 402 are preferably formed from n-type $Al_xGa_{1-x}As/Al_yGa_{1-y}As$ pairs of material with x ranging from 0 and 0.5, and y ranging from 0.5 and 1, and has five to twenty five pairs normally and ten pairs of layers in the preferred embodiment. The active area 404 can be GaAs, AlGaAs, or InGaAs quantum well structure and is preferably an InGaAs quantum well structure which can be a single quantum well or multiple quantum wells but in the preferred embodiment three to nine quantum wells are utilized. The cladding layer 406 is a p-type GaAs or AlGaAs and is preferably a p-type GaAs. The active area 404, the cladding 406, and a portion 403 of the DBR 402 have an external-angled beam steering element 412 and an internal-angled beam steering element 411 etched in their materials. Preferably the external-angled beam steering element 412 and the internal-angled beam steering element 411 are approximately forty five degree angles with the incident light and form the folded cavity of the folded cavity surface emitting laser 440. The long wavelength VCSEL 450 includes the DBR 412, a quantum well active area 414, a DBR 416, and a substrate 418. The DBR 412 can be GaAs/AlGaAs DBR, InP/InGaAsP DBR, or dielectric DBR, and is preferably a dielectric DBR. The active area 414 can be InGaAsP or InAlGaAs and is preferably an InGaAsP quantum well structure having multiple quantum wells. The DBR 416 can be GaAs/AlGaAs DBR, InGaAsP/InP or dielectric DBR, and is preferably made of pairs of InGaAsP/InP. The substrate 418 of the long wavelength VCSEL 450 can be GaAs or InP, and is preferably an InP substrate. DBRs 412 and 416 are preferably made of thicknesses to provide substantial (preferably 99% or more) reflection of long wavelengths at 1.3 $\mu$m or 1.55 $\mu$m to amplify and stimulate emission. The folded cavity surface emitting laser 440 and the long wavelength VCSEL 450 are integrated together at the interface 410 by either fusing, gluing, metal bonding, epoxy bonding or other well-known semiconductor bonding method. The interface 410 can alternately be an air gap in the case where the FCSEL 440 and the long wavelength VCSEL 450 are held mechanically aligned together. In operation, the folded cavity surface emitting laser 440 generates a short wavelength laser beam which is reflected between the beam steering element 411, beam steering element 412, DBR 402, and the top surface of cladding 406 as 409A, 409B and 409C. The in-plane laser beam 409A is reflected by beam steering element 411 into the substantially perpendicular beam 409B for coupling into the long wavelength VCSEL 450 to optically pump it. After becoming sufficiently pumped to reach lasing threshold, the long wavelength VCSEL 450 emits the long wavelength laser beam 444.

Figure 4B:
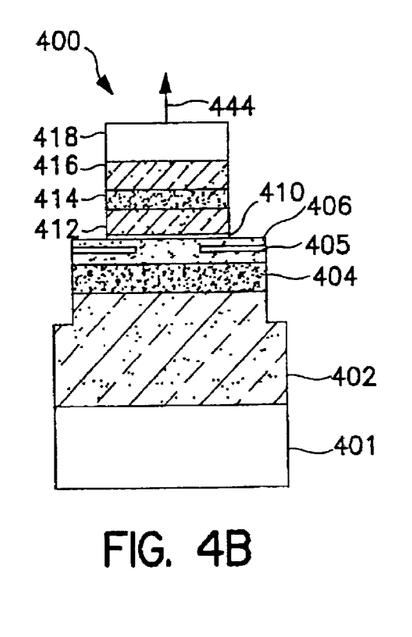

Referring now to FIG. 4B, a side cross-sectional view of the integrated optically pumped vertical cavity surface emitting laser 400 is illustrated. It can be seen in FIG. 4B that the cladding layer 406 includes an oxide ridge 405 which provides confinement in current injection for the FCSEL 440. The oxide ridge 405 is formed by oxidizing a portion of an Aluminum-Arsenide (AlAs) layer or an Aluminum-Gallium-Arsenide (AlGaAs) layer with very high Aluminum content into an Aluminum-Oxide (AlO$_2$) region.

Figure 5A:
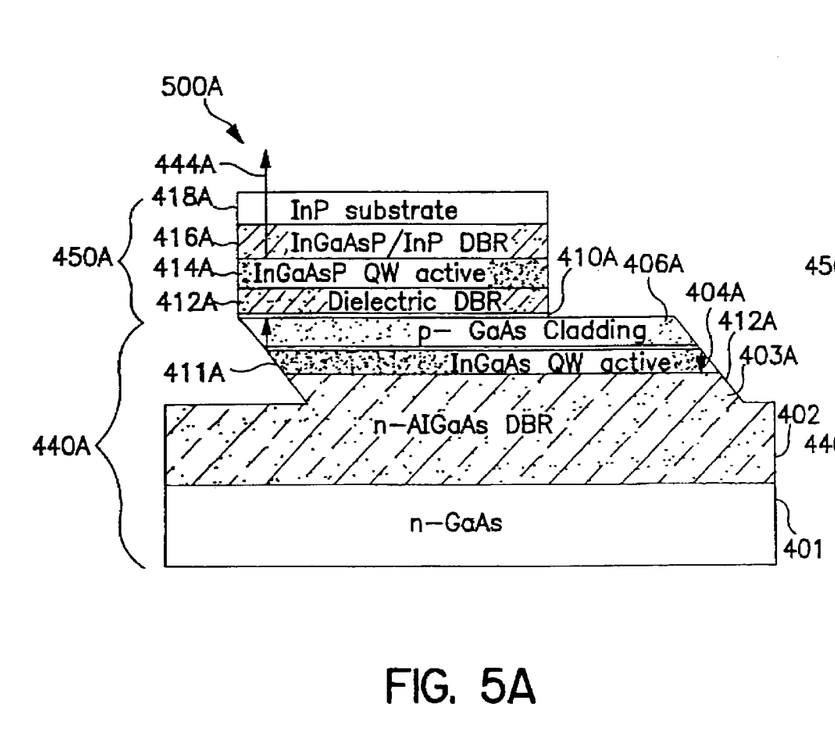
FIGS. 5A and 5B are magnified cross sectional views of an array of integrated optically pumped long wavelength VCSELs for a ninth embodiment of the present invention.
Figure 5B:
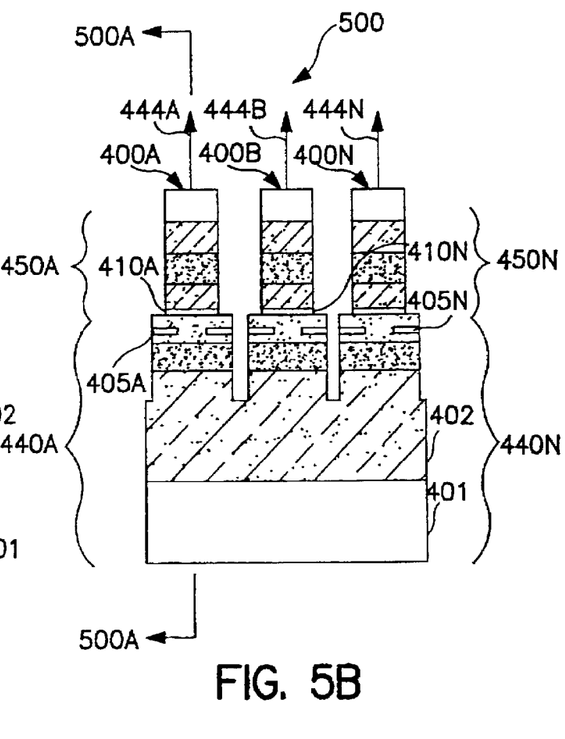

Referring now to FIGS. 5A and 5B, an integrated array of optically pumped long wavelength VCSELs 500 is illustrated. Essentially, integrated array 500 includes N integrated optically pumped VCSELs 400. In FIG. 5B, integrated VCSEL 400A through integrated VCSEL 400N are formed on the base layers of the substrate 401 and DBR 402. Each of the integrated VCSELs 400A through 400N are formed of separate folded cavity surface emitting lasers FCSELs 440A through 440N integrated with the long wavelength VCSELs 450A through 450N respectively. With each of the folded cavity surface emitting lasers 440A through 440N having one separate electrical contact, each of the integrated long wavelength VCSELs 400A through 400N can be individually controlled within the integrated array 500. Each of the integrated VCSELs 400A through 400N emits a separately controlled laser output 444A through 444N. Referring now to FIG. 5A, the cross-section of the integrated VCSEL 400A illustrates each instance of integrated optically pumped VCSELs 400A through 400N within the array. The folded vertical cavity surface emitting laser 440A includes the substrate 401, DBR 402, a section of the DBR 403A and active area 404A, a cladding layer 406A. The vertical long wavelength vertical cavity surface emitting laser 450A includes a dielectric DBR 412A and active area 414A, a DBR 416A and a substrate 418A. Each of the long wavelength vertical cavity surface lasers 450A through 450N couple to the respective folded cavity surface emitting laser 440A through 440N by means of the interface 410A through 410N. Each of the FCSELs 440A through 440N share the same substrate 401 and DBR 402. The materials used in FCSELs 440A through 440N and long wavelength VCSELs 450A through 450N are the same as those described with respect to the similarly numbered elements of the folded cavity surface emitting laser 440 and the long wavelength VCSEL 450 previously described with respect to FIG. 4A and 4B of the integrated optically pumped VCSEL 400. After integration of a large long wavelength VCSEL with a large FCSEL, all layers can be etched in the area between the long wavelength VCSELs 450A through 450N and some layers can be etched away in the area between the FCSELs 440A through 440N in order to form the array 500 of separately controlled integrated optically pumped VCSELs.

Each embodiment of the integrated optically pumped VCSEL provides wavelength conversion from a short wavelength laser beam to a long wavelength laser beam output. Each embodiment of the integrated optically pumped VCSEL can provide longitudinal mode conversion as well. Longitudinal mode is the spectral distribution of a laser beam as opposed to the transverse mode which effectively is the laser spatial mode. That is, with respect to the transverse mode, a multimode laser beam can be converted into a single mode laser beam output or a single mode laser beam can be converted into a multimode laser beam output. Alternatively no mode conversion need occur, such that, a short wavelength multimode laser beam is generated as a long wavelength multimode laser beam output and a short wavelength single mode laser beam is generated as a long wavelength single mode laser beam output. Whether a laser is single mode or multimode is determined by the implementation of the pump laser, that is the in-plane short wavelength laser, and the geometric layout of the long wavelength VCSEL.

The present invention has many advantages over the prior art. One advantage of the present invention is that it costs less to manufacture because it uses an in-plane short wavelength laser. Another advantage of the present invention is that it is less sensitive to temperature variance because it provides better heat dissipation through lower thermal and electrical resistivity. Another advantage of the present invention is that it is an integrated solution that can undergo wafer testing to determine faulty devices and known good dies. Other advantages of the present invention will become obvious to those of ordinary skill in the art after thoroughly reading this disclosure.

The preferred embodiments of the present invention are thus described. While the present invention has been described in particular embodiments, the present invention should not be construed as limited by such embodiments, but rather construed according to the claims that follow below.

What is claimed is:

1. An integrated optically pumped vertical cavity surface emitting laser comprising:
    an in-plane semiconductor laser to emit photons of a relatively short wavelength, the in-plane semiconductor laser being electrically pumped to generate the photons of the relatively short wavelength;
    a beam steering element coupled to the in-plane semiconductor laser, the beam steering element to steer the photons of the relatively short wavelength emitted at an incident angle from the in-plane semiconductor laser into a reflective angle; and
    a vertical cavity surface emitting laser joined to the in-plane semiconductor laser, the vertical cavity surface emitting laser to receive the photons of the relatively short wavelength emitted from the in-plane semiconductor laser and steered by the beam steering element to be optically pumped and emit photons of a long wavelength from a surface.

2. The integrated optically pumped vertical cavity surface emitting laser of claim 1 wherein,
the in-plane semiconductor laser is an edge emitting laser.

3. The integrated optically pumped vertical cavity surface emitting laser of claim 1 wherein,
the in-plane semiconductor laser is an in-plane surface emitting laser.

4. The integrated optically pumped vertical cavity surface emitting laser of claim 1 wherein,
the in-plane semiconductor laser is a grating surface emitting laser.

5. The integrated optically pumped vertical cavity surface emitting laser of claim 1 wherein,
the in-plane semiconductor laser is a folded cavity surface emitting laser.

6. The integrated optically pumped vertical cavity surface emitting laser of claim 5 wherein,
the folded cavity surface emitting laser includes,
an n-type Gallium-Arsenide substrate,
an n-type Aluminum-Gallium-Arsenide distributed Bragg reflector coupled to the substrate,
an active region having one or more Indium-Gallium-Arsenide quantum well structures,
a p-type Gallium-Arsenide cladding layer coupled to the active region,
an oxide confinement region formed within the cladding layer, and,
wherein, the beam steering element is an internal-angled beam steering element and an external-angled beam steering element formed in the edges of a portion of the n-type Aluminum-Gallium-Arsenide distributed Bragg reflector, the active region, and the cladding layer to steer photons towards the vertical cavity surface emitting laser.

7. The integrated optically pumped vertical cavity surface emitting laser of claim 6 wherein,
the vertical cavity surface emitting laser includes,
a first distributed Bragg reflector formed of a dielectric material,
an active region having one or more Indium-Gallium-Arsenide-Phosphide quantum well structures,
a second distributed Bragg reflector formed of layers of the pair of materials of Indium-Gallium-Arsenide-Phosphide/Indium-Phosphide, and
an Indium-Phosphide substrate coupled to the second distributed Bragg reflector.

8. The integrated optically pumped vertical cavity surface emitting laser of claim 1 wherein,
the in-plane semiconductor laser is electrically pumped to emit photons having a wavelength ranging from 600 nanometers to 1100 nanometers.

9. The integrated optically pumped vertical cavity surface emitting laser of claim 1 wherein,
the vertical cavity surface emitting laser is optically pumped to emit photons having a wavelength ranging from 1200 nanometers to 1750 nanometers.

10. The integrated optically pumped vertical cavity surface emitting laser of claim 1 wherein,
the vertical cavity surface emitting laser is joined to the in-plane semiconductor laser through one of the set of atomic bonding, wafer bonding, metal bonding, and epoxy bonding.

11. The integrated optically pumped vertical cavity surface emitting laser of claim 1 wherein,
the in-plane semiconductor laser includes a ridge waveguide forming a ridge waveguide in-plane semiconductor laser.

12. The integrated optically pumped vertical cavity surface emitting laser of claim 1 wherein,
the in-plane semiconductor laser includes a rib waveguide forming a rib waveguide in-plane semiconductor laser.

13. The integrated optically pumped vertical cavity surface emitting laser of claim 1 wherein,
the in-plane semiconductor laser includes an oxide confinement region forming an oxide confined in-plane semiconductor laser.

14. The integrated optically pumped vertical cavity surface emitting laser of claim 1 wherein,
the in-plane semiconductor laser is an in-plane laser having an Aluminum free active region.

15. The integrated optically pumped vertical cavity surface emitting laser of claim 1 wherein,
the in-plane semiconductor laser includes a laser cavity mirror that is a naturally cleaved facet.

16. The integrated optically pumped vertical cavity surface emitting laser of claim 1 wherein,
the in-plane semiconductor laser includes a laser cavity mirror that is an etched facet.

17. The integrated optically pumped vertical cavity surface emitting laser of claim 1 wherein,
the beam steering element is also a laser cavity mirror formed by etching a facet at an angle to amplify the energy of the photons in the laser cavity and to steer photons to the vertical cavity surface emitting laser.

18. The integrated optically pumped vertical cavity surface emitting laser of claim 17 wherein,
the angle that the facet is etched is in the range from thirty-five degrees to fifty-five degrees.

19. The integrated optically pumped vertical cavity surface emitting laser of claim 17 wherein,
the angle that the facet is etched is in the range from forty-two degrees to forty-eight degrees.

20. The integrated optically pumped vertical cavity surface emitting laser of claim 3 wherein,
the in-plane surface emitting laser includes a cladding layer and a semiconductor distributed Bragg reflector monolithically grown on the cladding layer to reflect and confine photons.

21. The integrated optically pumped vertical cavity surface emitting laser of claim 1 wherein,
the vertical cavity surface emitting laser is a long wavelength vertical cavity surface emitting laser having an active region formed of one or more Indium-Gallium-Arsenide-Phosphide quantum wells to be optically pumped and emit photons of a relatively long wavelength.

22. The integrated optically pumped vertical cavity surface emitting laser of claim 1 wherein,
the vertical cavity surface emitting laser is a long wavelength vertical cavity surface emitting laser having an active region formed of one or more Indium-Aluminum-Gallium-Arsenide quantum wells to be optically pumped and emit photons of a relatively long wavelength.

23. The integrated optically pumped vertical cavity surface emitting laser of claim 1 wherein,
the vertical cavity surface emitting laser is a long wavelength vertical cavity surface emitting laser having an active region formed of one or more Gallium-Arsenide-Antimonide quantum wells to be optically pumped and emit photons of a relatively long wavelength.

24. The integrated optically pumped vertical cavity surface emitting laser of claim 1 wherein, the vertical cavity surface emitting laser is a long wavelength vertical cavity surface emitting laser having an active region formed of one or more Indium-Gallium-Arsenide-Nitride quantum wells to be optically pumped and emit photons of a relatively long wavelength.

25. The integrated optically pumped vertical cavity surface emitting laser of claim 1 wherein, the vertical cavity surface emitting laser includes a first distributed Bragg reflector mirror formed of Aluminum-Gallium-Arsenide monolithically grown on a top layer of the in-plane semiconductor laser during its semiconductor manufacturing.

26. The integrated optically pumped vertical cavity surface emitting laser of claim 25 wherein, all other layers of the vertical cavity surface emitting laser are processed separately from the in-plane semiconductor laser, including an active region formed of one or more Indium-Gallium-Arsenide-Phosphide quantum wells, and are coupled to the first distributed Bragg reflector mirror grown on the in-plane semiconductor laser through wafer fusing.

27. The integrated optically pumped vertical cavity surface emitting laser of claim 25 wherein, all other layers of the vertical cavity surface emitting laser are processed separately from the in-plane semiconductor laser, including an active region formed of one or more Indium-Aluminum-Gallium-Arsenide quantum wells, and are coupled to the first distributed Bragg reflector mirror grown on the in-plane semiconductor laser through wafer fusing.

28. The integrated optically pumped vertical cavity surface emitting laser of claim 25 wherein, all other layers of the vertical cavity surface emitting laser are monolithically grown on top of the first distributed Bragg reflector mirror during semiconductor processing of the in-plane semiconductor laser including an active region formed of one or more Gallium-Arsenide-Antimonide quantum wells.

29. The integrated optically pumped vertical cavity surface emitting laser of claim 25 wherein, all other layers of the vertical cavity surface emitting laser are monolithically grown on top of the first distributed Bragg reflector mirror during semiconductor processing of the in-plane semiconductor laser including an active region formed of one or more Indium-Gallium-Arsenide-Nitride quantum wells.

30. The integrated optically pumped vertical cavity surface emitting laser of claim 1 wherein, the vertical cavity surface emitting laser includes an active region of one or more quantum wells, a first distributed Bragg reflector and a second distributed Bragg reflector, the second distributed Bragg reflector monolithically grown with the active region.

31. The integrated optically pumped vertical cavity surface emitting laser of claim 1 wherein, the vertical cavity surface emitting laser includes an active region of one or more quantum wells, a first distributed Bragg reflector, and a second distributed Bragg reflector, the second distributed Bragg reflector wafer fused to the active region.

32. The integrated optically pumped vertical cavity surface emitting laser of claim 1 wherein, the vertical cavity surface emitting laser includes an active region of one or more quantum wells, a first distributed Bragg reflector, and a second distributed Bragg reflector, the second distributed Bragg reflector metal bonded to the active region.

33. The integrated optically pumped vertical cavity surface emitting laser of claim 1 wherein, the vertical cavity surface emitting laser includes an active region of one or more quantum wells, a first distributed Bragg reflector, and a second distributed Bragg reflector, the second distributed Bragg reflector epoxy bonded to the active region.

34. The integrated optically pumped vertical cavity surface emitting laser of claim 1 wherein, the vertical cavity surface emitting laser is bonded to the in-plane semiconductor laser at an angle.

35. The integrated optically pumped vertical cavity surface emitting laser of claim 1 wherein, the vertical cavity surface emitting laser includes an active region of one or more quantum wells and a dielectric mirror deposited on top of the active region.

36. The integrated optically pumped vertical cavity surface emitting laser of claim 1 wherein, the vertical cavity surface emitting laser includes a dielectric mirror as its first distributed Bragg reflector.

37. The integrated optically pumped vertical cavity surface emitting laser of claim 1 wherein, the vertical cavity surface emitting laser includes an oxide region in a first or second distributed Bragg reflector to gain guide photons to emit at a single mode transversely.

38. The integrated optically pumped vertical cavity surface emitting laser of claim 1 wherein, the vertical cavity surface emitting laser includes one or more mesa regions patterned in a first or second distributed Bragg reflector to index guide photons to emit at a single mode transversely.

39. The integrated optically pumped vertical cavity surface emitting laser of claim 1 further comprising:

a third laser to generate a small spot pump beam to couple to the vertical cavity surface emitting laser to gain guide photons to emit at a single mode transversely.

40. The integrated optically pumped vertical cavity surface emitting laser of claim 1 wherein, the vertical cavity surface emitting laser includes a patterned dielectric mirror coupled to its active region to emit photons at a single mode transversely.

41. The integrated optically pumped vertical cavity surface emitting laser of claim 1 wherein, the beam steering element is integrated with the in-plane semiconductor laser.

42. The integrated optically pumped vertical cavity surface emitting laser of claim 41 wherein, the beam steering element is a grating.

43. The integrated optically pumped vertical cavity surface emitting laser of claim 41 wherein, the beam steering element is an angle etched facet.

44. The integrated optically pumped vertical cavity surface emitting laser of claim 43 wherein, the angle etched facet is integrated with the in-plane semiconductor laser as part of a laser cavity.

45. The integrated optically pumped vertical cavity surface emitting laser of claim 43 wherein, the angle etched facet is integrated with the in-plane semiconductor laser external to a laser cavity.

46. The integrated optically pumped vertical cavity surface emitting laser of claim 42 wherein,
the grating is integrated with the in-plane semiconductor laser as part of the laser cavity.

47. The integrated optically pumped vertical cavity surface emitting laser of claim 42 wherein,
the grating is integrated with the in-plane semiconductor laser external to the laser cavity.

48. A semiconductor laser apparatus comprising;
a first semiconductor laser and a second semiconductor laser integrated with the first semiconductor laser;
said first semiconductor laser having a lasing action substantially in a plane of a semiconductor epitaxial plane to generate a first laser bean, said first semiconductor laser responsive to electrical pumping;
said second semiconductor laser having a lasing action substantially perpendicular to the semiconductor epitaxial plane to generate a second laser beam, said second semiconductor laser responsive to optical pumping by the first semiconductor laser; and
a beam steering element to steer said first laser beam in a direction towards said second semiconductor laser.

49. A method of optically pumping a long wavelength vertical cavity surface emitting laser, the method comprising:
integrating a beam steering element with an in-plane semiconductor laser,
integrating a vertical cavity surface emitting laser to the in-plane semiconductor laser,
electrically pumping the in-plane semiconductor laser to generate a first plurality of photons,
steering the first plurality of photons towards the vertical cavity surface emitting laser by the beam steering element,
receiving the first plurality of photons in the vertical cavity surface emitting laser, and
generating a second plurality of photons in the vertical cavity surface emitting laser responsive to the receiving of the first plurality of photons.

50. The method of claim 49 wherein,
the in-plane semiconductor laser is an edge emitting laser.

51. The method of claim 50 wherein,
the beam steering element is external to the edge emitting laser and couples to a substrate of the edge emitting laser.

52. The method of claim 49 wherein,
the in-plane semiconductor laser is an in-plane surface emitting laser.

53. The method of claim 52 wherein,
the beam steering element is formed in the cavity of the in-plane surface emitting laser.

54. The semiconductor laser apparatus of claim 48 wherein,
said beam steering element is integrated with said first semiconductor laser.

55. The semiconductor laser apparatus of claim 54 wherein,
said beam steering element is a grating.

56. The semiconductor laser apparatus of claim 54 wherein,
said beam steering element is an angle etched facet.

57. The semiconductor laser apparatus of claim 55 wherein,
the angle etched facet is integrated with said first semiconductor laser as part of a laser cavity.

58. The semiconductor laser apparatus of claim 48 wherein,
said first semiconductor laser is an in-plane semiconductor laser.

59. The semiconductor laser apparatus of claim 58 wherein,
the in-plane semiconductor laser is an edge emitting laser.

60. The semiconductor laser apparatus of claim 58 wherein,
the in-plane semiconductor laser is an in-plane surface emitting laser.

61. The semiconductor laser apparatus of claim 58 wherein,
the in-plane semiconductor laser is a grating surface emitting laser.

62. The semiconductor laser apparatus of claim 58 wherein,
the in-plane semiconductor laser is a folded cavity surface emitting laser.

63. The semiconductor laser apparatus of claim 58 wherein,
said second semiconductor laser is a vertical cavity surface emitting laser.

64. A semiconductor laser comprising:
a vertical cavity surface emitting laser to emit photons of a relatively long wavelength;
a folded cavity surface emitting laser joined to the vertical cavity surface emitting laser, the folded cavity surface emitting laser to generate photons of a relatively short wavelength, the folded cavity surface emitting laser being electrically pumped to generate the photons of the relatively short wavelength, the folded cavity surface emitting laser including
a beam steering element to steer the photons of the relatively short wavelength from the folded cavity surface emitting laser towards the laser cavity of the vertical cavity surface emitting laser;
and wherein,
the vertical cavity surface emitting laser to receive the photons of the relatively short wavelength generated by the folded cavity surface emitting laser and steered by the beam steering element and to be optically pumped and emit the photons of the long wavelength from a surface.

65. The semiconductor laser of claim 64 wherein,
the folded cavity surface emitting laser includes,
an n-type Gallium-Arsenide substrate,
an n-type Aluminum-Gallium-Arsenide distributed Bragg reflector coupled to the substrate,
an active region having one or more Indium-Gallium-Arsenide quantum well structures,
a p-type Gallium-Arsenide cladding layer coupled to the active region,
an oxide confinement region formed within the cladding layer, and,
wherein, the beam steering element is an internal-angled beam steering element and an external-angled beam steering element formed in the edges of a portion of the n-type Aluminum-Gallium-Arsenide distributed Bragg reflector, the active region, and the cladding layer to steer photons towards the vertical cavity surface emitting laser.

66. The semiconductor laser of claim 65 wherein,
the vertical cavity surface emitting laser includes,
    a first distributed Bragg reflector formed of a dielectric material,
    an active region having one or more Indium-Gallium-Arsenide-Phosphide quantum well structures,
    a second distributed Bragg reflector formed of layers of the pair of materials of Indium-Gallium-Arsenide-Phosphide/Indium-Phosphide, and
    an Indium-Phosphide substrate coupled to the second distributed Bragg reflector.

67. The semiconductor laser of claim 64 wherein,
the vertical cavity surface emitting laser is a long wavelength vertical cavity surface emitting laser having an active region formed of one or more Indium-Gallium-Arsenide-Phosphide quantum wells to be optically pumped and emit photons of a relatively long wavelength.

68. The semiconductor laser of claim 64 wherein,
the vertical cavity surface emitting laser is a long wavelength vertical cavity surface emitting laser having an active region formed of one or more Indium-Aluminum-Gallium-Arsenide quantum wells to be optically pumped and emit photons of a relatively long wavelength.

69. The semiconductor laser of claim 64 wherein,
the vertical cavity surface emitting laser is a long wavelength vertical cavity surface emitting laser having an active region formed of one or more Gallium-Arsenide-Antimonide quantum wells to be optically pumped and emit photons of a relatively long wavelength.

70. The semiconductor laser of claim 64 wherein,
the vertical cavity surface emitting laser is a long wavelength vertical cavity surface emitting laser having an active region formed of one or more Indium-Gallium-Arsenide-Nitride quantum wells to be optically pumped and emit photons of a relatively long wavelength.

71. The semiconductor laser of claim 64 wherein,
the vertical cavity surface emitting laser includes an active region of one or more quantum wells, a first distributed Bragg reflector and a second distributed Bragg reflector, the second distributed Bragg reflector monolithically coupled to the active region.

* * * * *